(12) United States Patent
Haq et al.

(10) Patent No.: US 10,069,064 B1
(45) Date of Patent: Sep. 4, 2018

(54) MEMORY STRUCTURE HAVING A MAGNETIC TUNNEL JUNCTION (MTJ) SELF-ALIGNED TO A T-SHAPED BOTTOM ELECTRODE, AND METHOD OF MANUFACTURING THE SAME

(71) Applicant: Headway Technologies, Inc., Milpitas, CA (US)

(72) Inventors: Jesmin Haq, Milpitas, CA (US); Tom Zhong, Saratoga, CA (US); Zhongjian Teng, Santa Clara, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 15/653,180

(22) Filed: Jul. 18, 2017

(51) Int. Cl.
  *H01L 27/22* (2006.01)
  *H01L 43/12* (2006.01)
  *H01L 43/02* (2006.01)
  *H01L 43/08* (2006.01)

(52) U.S. Cl.
  CPC ............ *H01L 43/02* (2013.01); *H01L 27/222* (2013.01); *H01L 43/08* (2013.01); *H01L 43/12* (2013.01)

(58) Field of Classification Search
  CPC ..... H01L 27/222–27/228; H01L 43/00–43/14; G11C 11/15; G11C 19/08; G11C 14/0036; G11C 14/0081
  USPC ......................................................... 257/421
  See application file for complete search history.

(56) References Cited

U.S. PATENT DOCUMENTS

| 9,190,260 | B1 | 11/2015 | Zhang et al. | |
|---|---|---|---|---|
| 9,608,195 | B2 | 3/2017 | Huang et al. | |
| 2011/0272770 | A1* | 11/2011 | Hatada | H01L 27/228 257/421 |
| 2014/0349413 | A1* | 11/2014 | Chung | H01L 43/12 438/3 |
| 2015/0194595 | A1* | 7/2015 | Park | H01L 43/12 257/421 |
| 2017/0110649 | A1* | 4/2017 | Diaz | H01L 27/222 |

* cited by examiner

*Primary Examiner* — Marc Armand
*Assistant Examiner* — Younes Boulghassoul
(74) *Attorney, Agent, or Firm* — Saile Ackerman LLC; Stephen B. Ackerman (57) ABSTRACT

A process flow for forming a magnetic tunnel junction (MTJ) cell that is self-aligned to an underlying bottom electrode (BE) is disclosed. The BE is comprised of a lower BE layer having a first width (w1), and an upper (second) BE layer with a second width (w2) where w2>w1. Preferably, the BE has a T shape. A stack of MTJ layers including an uppermost hard mask is deposited on the BE and has width w2 because of a self-aligned deposition process. A dummy MTJ stack is also formed around the first BE layer. An ion beam etch where ions are at an incident angle <90° with respect to the substrate is used to remove extraneous material on the sidewall. Thereafter, an encapsulation layer is deposited to insulate the MTJ cell, and to fill a gap between the first BE layer and dummy MTJ stack.

24 Claims, 9 Drawing Sheets

MEMORY STRUCTURE HAVING A MAGNETIC TUNNEL JUNCTION (MTJ) SELF-ALIGNED TO A T-SHAPED BOTTOM ELECTRODE, AND METHOD OF MANUFACTURING THE SAME

TECHNICAL FIELD

The present disclosure relates to a method of forming an array of MTJ cells wherein each MTJ cell is deposited by a self-aligned process on a patterned bottom electrode that defines the width of the MTJ cell thereby providing improvement in the magnetoresistive ratio and other magnetic properties by avoiding MTJ sidewall damage caused by conventional etch processes that are used to transfer a mask pattern through a MTJ stack of layers.

BACKGROUND

A MTJ memory element is also referred to as a MTJ cell or MTJ and is a key component in magnetic recording devices, and in memory devices such as magnetic random access memory (MRAM) and spin torque transfer (STT)-MRAM. The fabrication method and the integration scheme with a complementary silicon oxide semiconductor (CMOS) substructure are two of the critical factors required for successful commercial production of MRAM. This new kind of non-volatile memory will be a replacement for DRAM, SRAM and flash. In MRAM design, the memory element is the magnetic tunnel junction (MTJ) that consists of two ferromagnetic layers separated by a thin insulating layer referred as a tunnel barrier layer. One of the ferromagnetic layers has perpendicular magnetic anisotropy (PMA), or is pinned by an antiferromagnetic layer set to a fixed magnetic moment in-plane orientation. The orientation of the other ferromagnetic layer referred as a free layer, is free to switch between a parallel and antiparallel direction to the pinned layer. When the magnetic moments of the two ferromagnetic layers are parallel, the resistance of the MTJ is lower compared with an antiparallel orientation, and these two orientations correspond to two memory states. The resistance of a MTJ cell is measured by powering the corresponding transistor which flows current from a bit line through the MTJ to a source line or vice versa. The magnetoresistive ratio is expressed by dR/R where dR is the difference in resistance between the two memory states when a current is passed through the MTJ, and R is the minimum resistance value.

Figure 1:
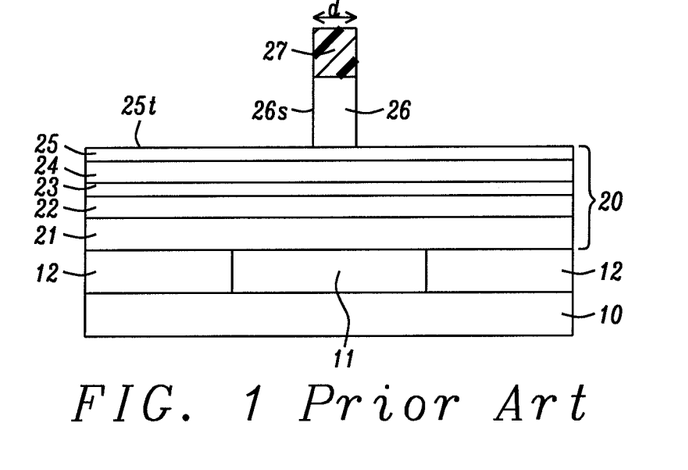
FIG. 1 is a cross-sectional view showing a conventional method of using a patterned photoresist mask to etch a hard mask on a MTJ stack of layers.

An important step in fabricating an array of MTJs on a substrate is etch transfer of a pattern in an overlying hard mask through a MTJ stack of layers to form a plurality of MTJ cells with a critical dimension d that in state of the art devices is substantially less than 100 nm from a top-down view. Some of the MTJ layers have a thickness as small as 10 to 20 Angstroms. As shown in FIG. 1, the MTJ stack typically has a seed layer 21, pinned layer 22, tunnel barrier layer 23, free layer 24, cap layer 25, and hard mask layer 26 that are sequentially formed on a bottom electrode 11. The cap layer may be a metal oxide to enhance PMA in the free layer while the hard mask is usually a metal such as Ta that serves as a protective layer during subsequent physical and chemical etches. The bottom electrode also known as a bit line is insulated from other bit lines (not shown) by insulation layer 12, and is formed on a CMOS substructure 10 generally comprised of transistors, vias, and other components. MRAM device fabrication requires patterning the MTJ stack by one or more reactive ion etch (RIE) or ion beam etch (IBE) steps. First, a photo mask pattern 27 having a critical dimension d is formed on the hard mask. A first etch step is employed to transfer the shape in the photo mask through the hard mask thereby forming sidewall 26s.

Figure 2:
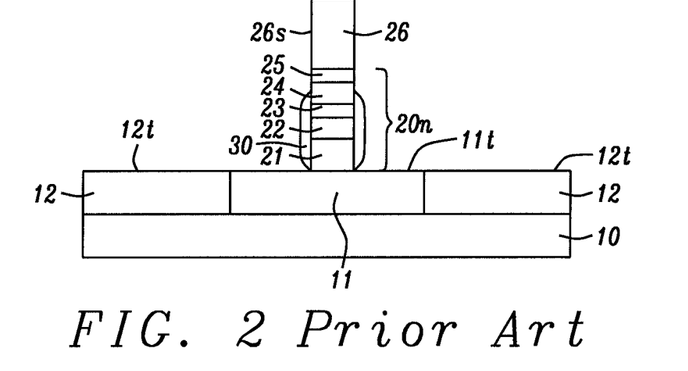
FIG. 2 is a cross-sectional view of the MTJ stack in FIG. 1 after an etch process transfers the hard mask pattern through the remaining MTJ layers according to conventional MTJ fabrication method.

Referring to FIG. 2, the hard mask 26 serves as a protective mask during one or more etch steps that transfer the shape and critical dimension in the hard mask through the remaining layers in MTJ stack thereby forming MTJ cell 20n. The thin MTJ layers are easily damaged proximate to sidewall 26s that extends from a top surface of the hard mask to top surface 11t of the bottom electrode. Moreover, redeposition of a metal layer 30 along the sidewall of the MTJ due to the non-volatile nature of etch by-products leads to shorting around the tunnel barrier layer 23, for example. Thus, MRAM device performance is degraded or may become non-functional. Accordingly, the most important challenge for MRAM cell fabrication is the patterning of the MTJ stack without damaging or shorting the device.

The etch transfer process through the MTJ stack of layers is challenging since there are a variety of materials (magnetic alloys, non-magnetic metals, and dielectric films) that each have a different etch rate when subjected to IBE with Ar or to conventional $CH_3OH$ based RIE. Care must be taken to select a hard mask 26 with a substantially lower etch rate than underlying layers in MTJ stack 20. Moreover, methanol RIE causes chemical and plasma damage on MTJ sidewalls although there is minimal redeposition of etched material on the sidewalls. For large device sizes, the damaged area is minor compared with non-damaged area and may not be critical. However, with the scaling down of the device size where d is below 100 nm, the amount of damaged area will become significant and degrade the magnetic properties of the MTJ. On the other hand, IBE produces no chemical damage and leaves minimal plasma damage, but results in a high degree of redeposited material on MTJ sidewalls. Redeposition at the MTJ sidewall is the key concern for IBE, especially for high density arrays with limited pitch between the MTJ cells. Increased cell density will limit the incident angle of the ion beam and possibly leave the redeposited material at the sidewall causing shorting of the devices.

Therefore, an improved method for fabricating an array of MTJ cells is needed that avoids patterning a hard mask on a MTJ stack of layers, and subsequent etching through the underlying MTJ stack. In particular, a method is desired that enables MTJ patterning without subjecting the sidewalls to ionic or chemical species that can damage the MTJ layers.

SUMMARY

One objective of the present disclosure is to provide a method for depositing all MTJ layers in a memory device such that no subsequent patterning step is needed to determine the shape and critical dimension of the MTJ.

A second objective of the present disclosure is to provide a process flow according to the first objective that will also improve throughput, and reduce film stress and stress related defects that are associated with a conventional method of patterning a continuous deposited film in an unpatterned MTJ stack of layers.

According to one embodiment, the first objective is achieved by first depositing a bottom electrode (BE) stack of layers with a first (bottom) layer and a second (upper) layer on a top surface of a substrate. The substrate comprises a transistor to control a current through the MTJ, and vias that connect each transistor with a bit line below each bottom electrode. The first and second BE layers are comprised of different materials such that a subsequent patterning and isotropic etch sequence forms a plurality of bottom electrodes each having a T-shape or undercut shape wherein the upper BE layer has a greater width than that of the lower BE layer. In an alternative embodiment, the second BE layer is replaced by a seed layer that also serves as the bottommost layer in the MTJ cell. Thereafter, an optional insulation layer is conformally deposited at the sides of the first BE and second BE (or seed) layers.

In the following step, a seed layer, pinned layer, tunnel barrier layer, free layer, capping layer, and a hard mask are sequentially deposited on the second BE layer, or the aforementioned layers without the seed layer are deposited on the seed layer in the alternative embodiment. As a result, a MTJ cell is self-aligned to each second BE layer (or to each seed layer), and a dummy stack of MTJ layers is formed on the substrate top surface around the first BE layer. However, the T-shape of the bottom electrode prevents the dummy MTJ stack from actually contacting the first BE layer. No further patterning process is necessary to determine the shape and size of the MTJ cells because of the self-aligned process during deposition of the MTJ layers. The width of the second BE layer or seed layer defines the critical dimension of the MTJ cell.

Since there is build up of conductive material along MTJ sidewalls during deposition of the MTJ layers, an angled ion beam etch (IBE) is preferably performed after the MTJ stack is deposited, and comprises rotating the substrate while conductive material is trimmed from the sidewalls. Next, a dielectric material also called an encapsulation layer is deposited to fill the gaps between adjacent MTJ cells and also in the gaps between each first BE layer sidewall and a surrounding dummy MTJ stack of layers. A chemical mechanical polish (CMP) may be employed to form a top surface on the encapsulation layer that is coplanar with a top surface of the hard mask on each MTJ cell.

BRIEF DESCRIPTION OF THE DRAWINGS

FIGS. 15-18a are cross-sectional views depicting the processes shown previously in FIGS. 7-10a, respectively, except that a seed layer replaces the second BE layer according to a second embodiment of the present disclosure.

DETAILED DESCRIPTION

The present disclosure is a process of forming a MTJ cell that is self-aligned to a bottom electrode layer or to an underlying seed layer thereby avoiding the need for a patterning step after a MTJ stack of layers is deposited. Although only one MTJ cell is depicted in the drawings with cross-sectional views, one skilled in the art will appreciate that a plurality of MTJs is formed in a typical memory device pattern. The terms "MTJ" and MTJ cell" are used interchangeably when referring to a MTJ stack of layers with a critical dimension that is determined by a sidewall, and is formed on a bottom electrode in a MRAM, STT-MRAM, or in a spintronic device including but not limited to a spin torque oscillator (STO).

Figure 10A:
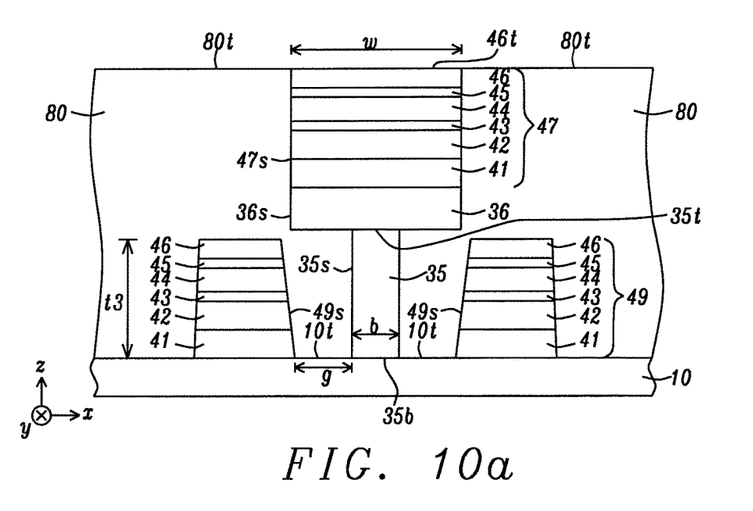
FIG. 10a is a cross-sectional view of the intermediate MTJ cell in FIG. 9 after a CMP process is used to planarize a top surface of the encapsulation layer according to an embodiment of the present disclosure.

Referring to FIG. 10a, a cross-sectional view is shown of a completed MTJ cell 47 that is self-aligned to a second bottom electrode (BE) layer 36 such that MTJ sidewall 47s forms a planar surface with BE sidewall 36s according to a first embodiment of the present disclosure. The second BE layer is formed on a first BE layer 35 and has a width w that is greater than width b of base 35b of the first BE layer. In the exemplary embodiment, sidewall 35s on the first BE layer is substantially vertical where top surface 35t thereof also has width b. In other embodiments, sidewalls 35s may be sloped such that top surface 35t has a width less than w, but greater than b where base 35b adjoins the substrate 10. The z-axis is a thickness direction and is perpendicular to the planes of the layers in MTJ cell. The x-axis and y-axis directions are in the plane of each MTJ layer. The substrate may be a multilayer structure comprised of a plurality of transistors where each transistor is connected to a bottom electrode base through a bit line and vias (not shown).

MTJ cell 47 comprises a seed layer 41, pinned or reference layer 42, tunnel barrier 43, free layer 44, capping layer 45, and hard mask 46 that are sequentially formed on the second BE layer 36. Each of the pinned layer and free layer preferably have PMA with a magnetization aligned in a positive or negative z-axis direction. The seed layer may comprise one or a plurality of sub-layers and is made of one or more of NiCr, Ta, Ru, Ti, TaN, Cu, Mg, or other materials typically employed to promote a smooth and uniform grain structure in overlying layers, and preferably enhance PMA in the pinned layer. In embodiments where sidewalls 36s, 47s form a substantially vertical surface, width w of the second BE layer is essentially maintained in the overlying MTJ layers.

The pinned layer 42 may have a synthetic anti-parallel (SyAP) configuration represented by AP2/Ru/AP1 where an anti-ferromagnetic coupling layer made of Ru, Rh, or Ir, for example, is sandwiched between an AP2 magnetic layer and an AP1 magnetic layer (not shown). The AP2 layer, which is also referred to as the outer pinned layer is formed on the seed layer 41 while AP1 is the inner pinned layer and typically contacts the tunnel barrier 43. AP1 and AP2 layers may be comprised of CoFe, CoFeB, Co, or a combination thereof. In other embodiments, the reference layer may be a laminated stack with intrinsic PMA such as $(Co/Ni)_n$, $(CoFe/Ni)_n$, $(Co/NiFe)_n$, $(Co/Pt)_n$, $(Co/Pd)_n$, or the like where n is the lamination number. Furthermore, a transitional layer such as CoFeB or Co may be inserted between the uppermost layer in the laminated stack and the tunnel barrier layer.

Tunnel barrier layer 43 is preferably a metal oxide that is one of MgO, TiOx, AlTiO, MgZnO, $Al_2O_3$, ZnO, ZrOx, HfOx, or MgTaO. More preferably, MgO is selected as the tunnel barrier layer because MgO provides the highest magnetoresistive ratio, especially when sandwiched between two CoFeB layers, for example.

Free layer 44 may be Co, Fe, CoFe, or an alloy thereof with one or both of B and Ni, or a multilayer stack comprising a combination of one or more of the aforementioned compositions. In another embodiment, the free layer may have a non-magnetic moment diluting layer such as Ta or Mg inserted between two CoFe or CoFeB layers that are ferromagnetically coupled. In an alternative embodiment, the free layer has a SyAP configuration such as FL1/Ru/FL2 where FL1 and FL2 are two magnetic layers that are antiferromagnetically coupled, or is a laminated stack such as $(Co/Ni)_n$ with inherent PMA described previously with respect to the reference layer composition.

Capping layer 45 is preferably a metal oxide such as MgO or another metal oxide that induces or enhances PMA in free layer 44. Hard mask 46 is typically comprised of one or more of Ta, Ru, TaN, Ti, TiN, and W. It should be understood that other hard mask materials including MnPt may be selected in order to provide high etch resistance relative to the surrounding encapsulation layer during a chemical mechanical polish (CMP) process that generates a top surface 46t which is coplanar with top surface 80t of the encapsulation layer.

The memory device comprised of MTJ cell 47 and bottom electrode layers 35, 36 is insulated from adjacent MTJ cells (not shown) by encapsulation layer 80 having top surface 80t that is coplanar with top surface 46t of hard mask layer 46. The encapsulation layer contacts substrate top surface 10t, and also separates sidewall 35s of the first BE layer 35 from dummy MTJ stack 49 that surrounds the first BE layer. The dummy MTJ stack comprises the same layers 41-46 that are present in the MTJ cell but is inactive since there is no electrical connection to other conductive components in the memory device. An important feature is that the bottom electrode is substantially in the shape of a T wherein b is considerably less than w to provide a gap g between sidewall 49s of the dummy MTJ and sidewall 35s thereby preventing any metal or alloy layers in the dummy MTJ from contacting the first BE layer and establishing an electrical connection thereto.

Encapsulation layer 80 is comprised of a dielectric material that is one or more of a metal carbide, metal nitride, metal oxynitride, or metal carbonitride such as SiN, $SiO_2$, SiON, MgO, $Al_2O_3$, AlN, BN, BON, BCN, SiC, or the like that is deposited by physical vapor deposition (PVD), chemical vapor deposition (CVD), plasma enhanced CVD (PECVD), ion beam deposition (IBD), or atomic layer deposition (ALD). In some embodiments, the encapsulation layer may include a first sub-layer that contacts sidewalls 47s, 49s, 35s, and 36s, and a second sub-layer on the first sub-layer (not shown).

Figure 10B:
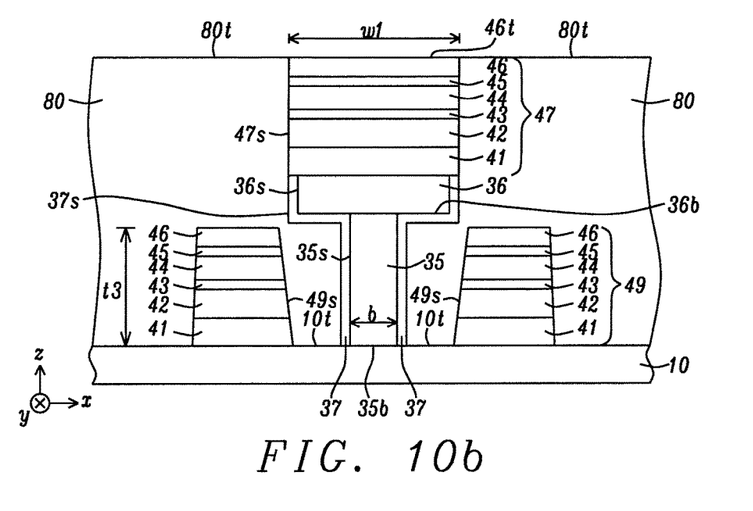
FIG. 10b is an alternative embodiment of the intermediate MTJ cell in FIG. 10a in which an insulation layer is formed at the sidewall and bottom surface of the second BE layer and at the sidewall of the first BE layer.

FIG. 10b shows an alternative embodiment that retains all of the features in FIG. 10a, and includes an additional dielectric layer 37 on sidewalls 35s, 36s, and on a bottom surface 36b of the second BE layer. The dielectric layer is preferably conformal and has sidewall 37s proximate to sidewall 36s, and is made of silicon oxide, silicon nitride, silicon oxynitride, or the like that electrically insulates the bottom electrode. As a result, MTJ 47 has a width w1 greater than w in the first embodiment where w1 is defined by the width of the second BE layer 36 and by the thickness of dielectric layer 37. In other words, the MTJ cell is self-aligned to the second BE layer and dielectric layer such that MTJ sidewall 47s is coplanar with sidewall 37s.

Figure 18A:
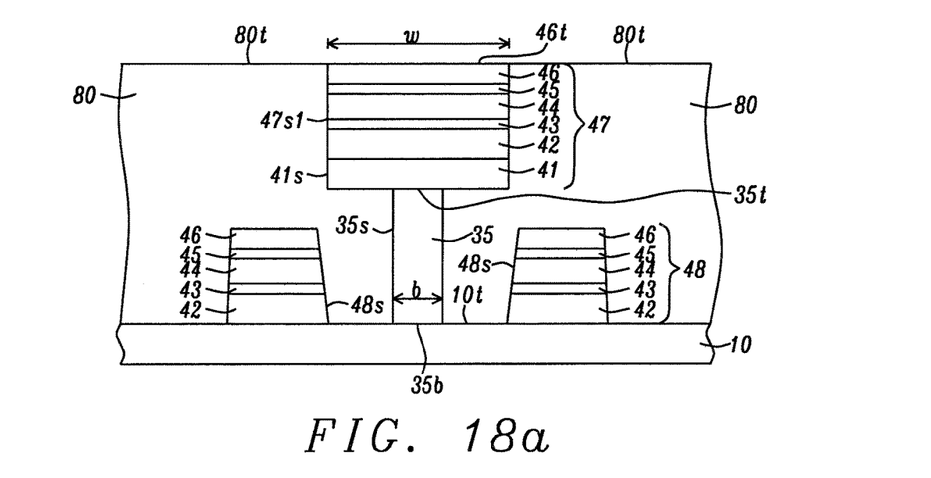

According to a second embodiment of the present disclosure shown in FIG. 18a, the MTJ structure in FIG. 10a is modified by replacing second BE layer 36 with seed layer 41. In other words, the seed layer contacts top surface 35t of the first BE layer and has width w that is greater than width b of the first BE layer base 35b. Here, overlying layers 42-46 described previously are self-aligned to the seed layer and form MTJ cell 47 that includes the seed layer. Other features from the first embodiment are retained including encapsulation layer 80 with top surface 80t that is coplanar with top surface 46t of hard mask 46. Preferably, the seed layer contacts a top surface 35t of the first BE layer, and forms a T shape with the first BE layer to prevent the surrounding dummy MTJ stack 48 from contacting sidewall 35s. Note that the dummy MTJ stack no longer has a seed layer contacting top surface 10t of substrate 10. Instead, pinned layer 42 is the bottommost layer in the dummy MTJ stack that comprises layers 42-46 and has sidewall 48s. Sidewall 41s of the seed layer in MTJ cell 47 is coplanar with sidewall 47s1 at the sides of overlying MTJ layers 42-46.

Figure 18B:
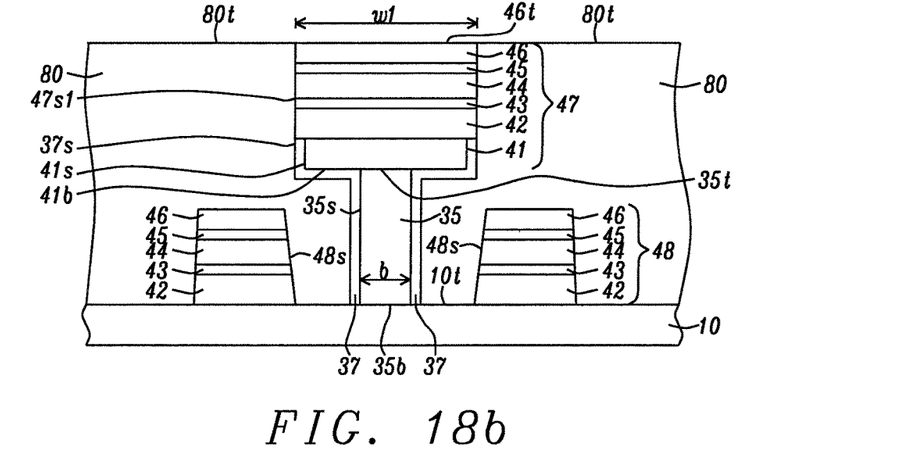
FIG. 18b is an alternative embodiment of the MTJ cell in FIG. 18a in which an insulation layer is formed at the sidewall and bottom surface of the seed layer and at the sidewall of the first BE layer.

FIG. 18b shows an alternative embodiment that retains all of the features in FIG. 18a, and includes an additional dielectric layer 37 on sidewalls 35s, 41s, and on a bottom surface 41b of the seed layer. The insulation layer, as previously described, is preferably a conformal layer with sidewall 37s proximate to sidewall 41s, and electrically insulates the first BE layer 35 and seed layer 41. In this case, MTJ 47 has a width w1 greater than w in the first embodiment where w1 is defined by the width of the seed layer and by the thickness of dielectric layer 37. Thus, the MTJ cell is self-aligned to the seed layer and to the dielectric layer such that sidewall 37s is coplanar with MTJ sidewall 47s1.

The present disclosure also encompasses a method of making the MTJ cells depicted in FIG. 10a and FIG. 18a. A first set of drawings shown as FIGS. 3-9 depicts a sequence of steps used to fabricate MTJ cell 47 in FIG. 10a. The method is believed to be advantageous over the prior art in that a smaller number of process steps are required to generate a self-aligned MTJ cell that maintains MTJ magnetic properties while avoiding damage to the MTJ sidewall. Accordingly, the cost associated with manufacturing the MTJ cell is considerably less.

Figure 3:
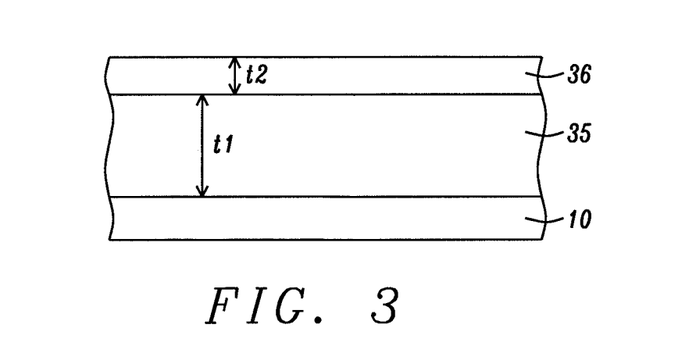
FIG. 3 is cross-sectional view that depicts first and second bottom electrode (BE) layers formed on a substrate according to an embodiment described herein.

Referring to FIG. 3, a first BE layer 35 and second BE layer 36 are sequentially deposited on substrate 10. The first BE layer has a thickness t1, and is selected from Ta, TaN, Ti, or TiN. The second BE layer has a thickness t2, where t2<t1, and is preferably one of Ni, NiCr, Ru, or NiFeCr. It is important that t1 is greater than thickness t3 of the dummy MTJ stack 49 (FIG. 10a) to prevent an upper portion of the dummy MTJ from contacting second BE layer 36 during subsequent processing steps.

Figure 4:
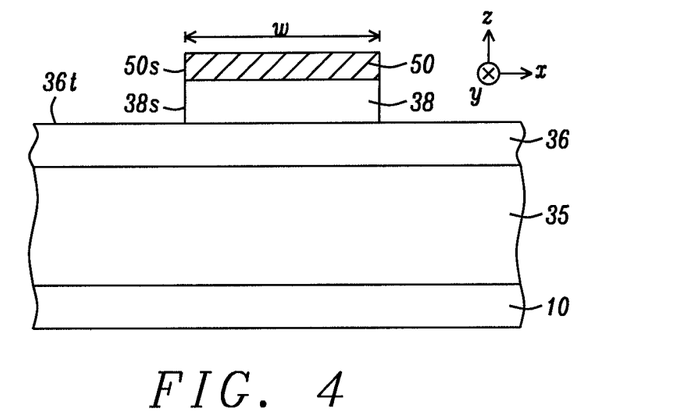
FIGS. 4-5 are cross-sectional view of the BE layers in FIG. 3 after a hard mask is deposited on the second BE layer and a patterning process and subsequent etch steps are used to form a T-shape where the second BE layer has a greater width than the first BE layer according to an embodiment of the present disclosure.

In FIG. 4, a hard mask 38 that is made of silicon oxide or silicon oxynitride, for example, and photoresist layer 50 are sequentially formed on the second BE layer 36. The photoresist layer is patterned with a conventional photolithography process to yield sidewall 50s. The patterned layer has a width w in the x-axis direction. In some embodiments, the sidewall forms a circular shape from a top-down view (not shown) such that a dimension (length) w is also formed in the y-axis direction. In other embodiments, the sidewall has a substantially elliptical shape where the length in the y-axis direction is unequal to the width along the x-axis. During a first etch step, a RIE comprising a fluorocarbon gas and a RF power in the range of 100 to 1500 Watts, for example, is employed to remove portions of the hard mask that are not protected by the photoresist layer (mask) thereby forming sidewall 38s that is coplanar with sidewall 50s. The first RIE stops on a top surface 36t of the second BE layer.

Figure 5:
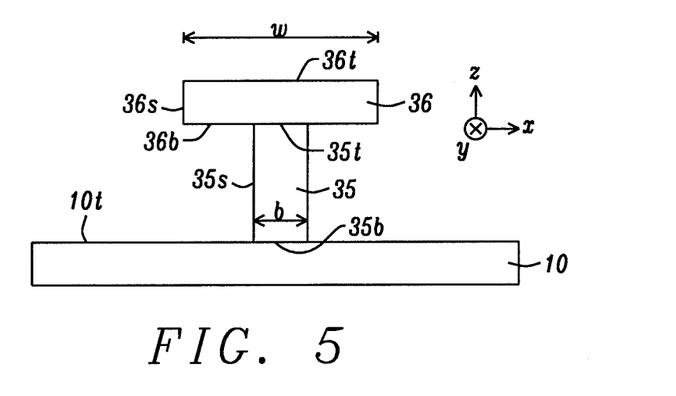

Referring to FIG. 5, the photoresist layer may be removed by a conventional oxygen plasma strip process. Then, a second RIE is performed and may be comprised of $CH_3OH$ or another oxidant, and a noble gas such as Ar to selectively remove portions of the second BE layer and stop on a top surface of the first BE layer 35 thereby generating sidewall 36s that is coplanar with sidewall 38s. Thereafter, a third RIE that is an isotropic etch is employed to advantageously form the T shape profile for the bottom electrode. In a preferred embodiment, the third RIE comprises fluorocarbon plasma and removes the hard mask thereby exposing top surface 36t of the second BE layer. The second BE layer and substrate are substantially more resistant to the fluorocarbon plasma than the first BE layer so that the second BE layer maintains width w, and the third RIE step stops on substrate top surface 10t. Depending on the etch conditions and composition of the first BE layer 35, the third RIE may generate a sloped sidewall 35s where the width at the first BE top surface 35t is greater than the width b at the base 35b, but is still less than w.

Figure 6:
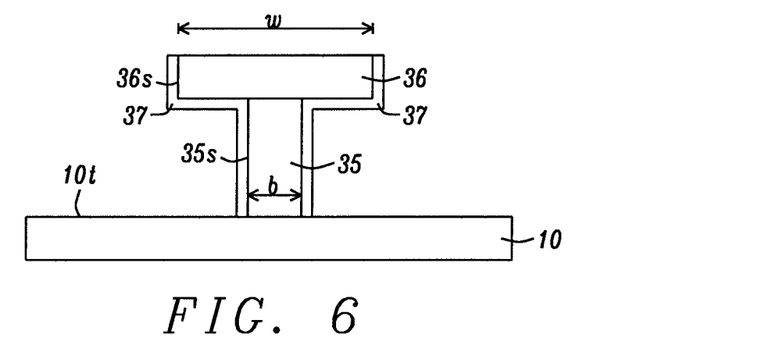
FIG. 6 is a cross-sectional view of the BE layers in FIG. 5 after the hard mask is removed and an optional insulation layer is formed on the sidewalls of the first and second BE layers according to an embodiment of the present disclosure.

Referring to FIG. 6, an optional dielectric layer 37 may be conformally deposited on first BE layer sidewall 35s and on second BE layer sidewall 36s by a chemical vapor deposition (CVD) method. The dielectric layer is made of $SiO_2$, SiN, SiON, or another material such as alumina, and serves to insulate both layers in the bottom electrode from conductive material that is sputter deposited when forming the MTJ layers in a subsequent step. Note that a sputter etch may be employed to remove the optional dielectric layer from above the top surface 36t of second BE layer 36.

Figure 7:
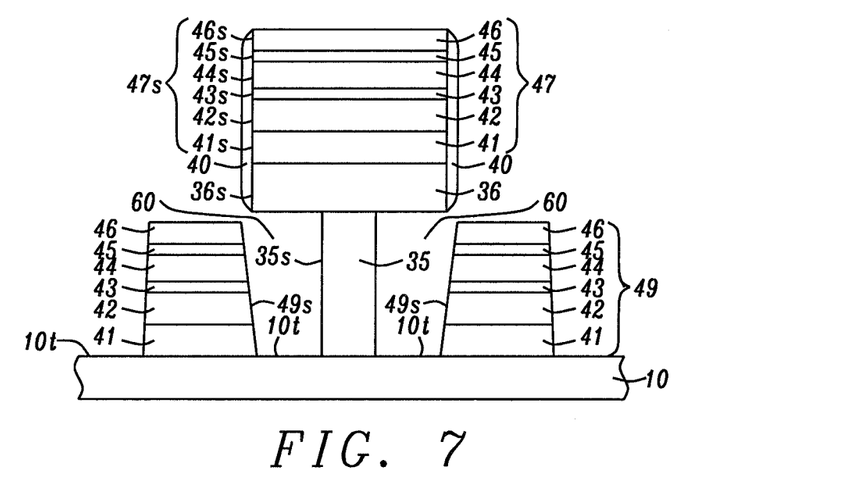
FIG. 7 is a cross-sectional view of the intermediate structure in FIG. 5 after the hard mask is removed, and a stack of MTJ layers is deposited and is self-aligned to the second BE layer according to an embodiment of the present disclosure.

Referring to FIG. 7, MTJ layers 41-46 are sequentially deposited in a DC sputter deposition system that includes ultra high vacuum DC magnetron sputter chambers with multiple targets and at least one oxidation chamber. Usually, the sputter deposition process comprises a noble gas such as argon and a base pressure between $5 \times 10^{-8}$ and $5 \times 10^{-9}$ torr. For tunnel barrier layer 43 and capping layer 45, the process of forming a metal oxide layer may include depositing a first metal layer, and performing a natural oxidation process to convert the first metal layer to a metal oxide. In some embodiments, a second metal layer is deposited on the metal oxide layer to form the tunnel barrier layer. During a subsequent annealing step, the second metal layer is oxidized by absorption of oxygen from the metal oxide layer and from other adjoining layers.

The process of forming a self-aligned MTJ cell 47 on the second BE layer 36 also results in formation of the dummy MTJ stack 49 on substrate 10, and surrounding the first BE layer 35. Thus, from a top-down view (not shown), the dummy MTJ stack forms a ring shape around MTJ 47. There is a gap 60 between sidewall 49s of the dummy MTJ stack and first BE layer sidewall 35s. Moreover, a sidewall layer 40 comprised of material from MTJ layers 41-46 forms on sidewall 36s, and on sidewall 47s that consists of sidewalls 41s-46s on each of the MTJ layers. Sidewall layer 40 must be removed before completing the fabrication process since conductive materials therein tend to form a shorting pathway around the tunnel barrier layer 43 in the MTJ cell. Note that slope 49s of the dummy MTJ stack is usually non-vertical such that uppermost layer 46 has a smaller width than seed layer 41 at the substrate top surface 10t. The non-vertical slope is a result of a gradual build up of sidewall layer 40. As the sidewall layer grows outward, there is a greater shadow effect that prevents deposition of sputtered material on portions of the dummy MTJ directly below layer 40.

Figure 8:
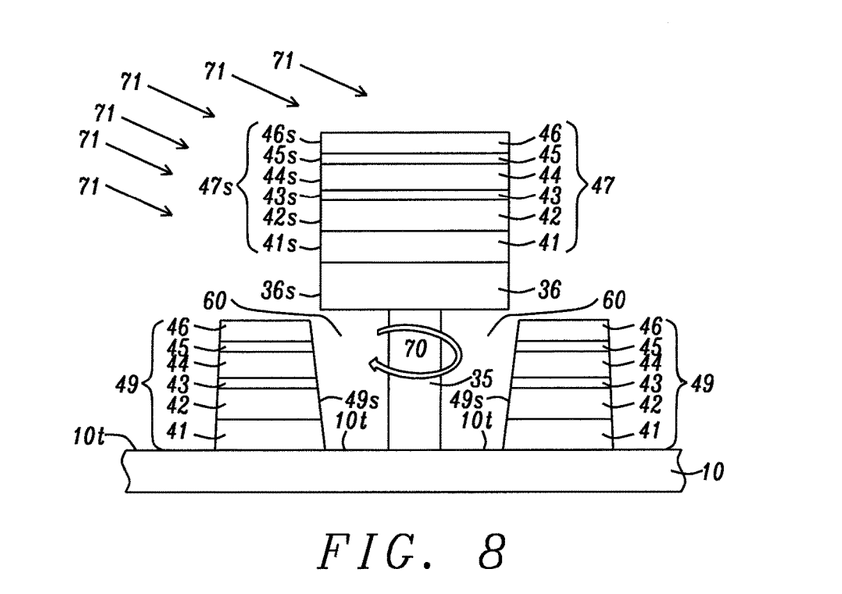
FIG. 8 is a cross-sectional view of the MTJ in FIG. 7 after an IBE is employed to remove conductive residue along the sidewall of the MTJ layers according to an embodiment of the present disclosure.

Referring to FIG. 8, an IBE is performed wherein ions 71 are directed at an incident angle α less than 90° towards sidewalls 36s, 47s. In some embodiments, the incident angle may be varied during the IBE. This IBE step comprises a noble gas that is one or more of Ar, Kr, Ne, and Xe, and rotating the work piece (wafer) on which the MTJ stack of layers and substrate is formed. The rotation 70 may be in a constant circular direction, or may comprise a sweeping motion wherein the wafer is rotated in a first direction during a first period of time, and then moved in an opposite direction for a second period of time. Furthermore, oxygen may be added to Ar to oxidize metallic material in sidewall layer 40, which then becomes more volatile and more easily removed in the reduced pressure environment. Accordingly, the sidewall layer is removed from the MTJ cell along sidewalls 36s, 47s by employing IBE conditions such as <200 eV and a process time typically less than 1 minute that do not require an over etch.

Note that an IBE process in a conventional MTJ fabrication scheme where a MTJ sidewall is formed requires a substantial over etch time since there is no etch selectivity of the hard mask with respect to underlying MTJ layers having a combined thickness generally in hundreds of nm. In the exemplary embodiment, no over etch condition is needed since the IBE step is effectively a cleaning step to remove a relatively thin sidewall layer 40. Accordingly, the reduced IBE process time is another factor in improving throughput compared with a conventional scheme that requires a MTJ etch with over etch time to form a MTJ sidewall.

Figure 9:
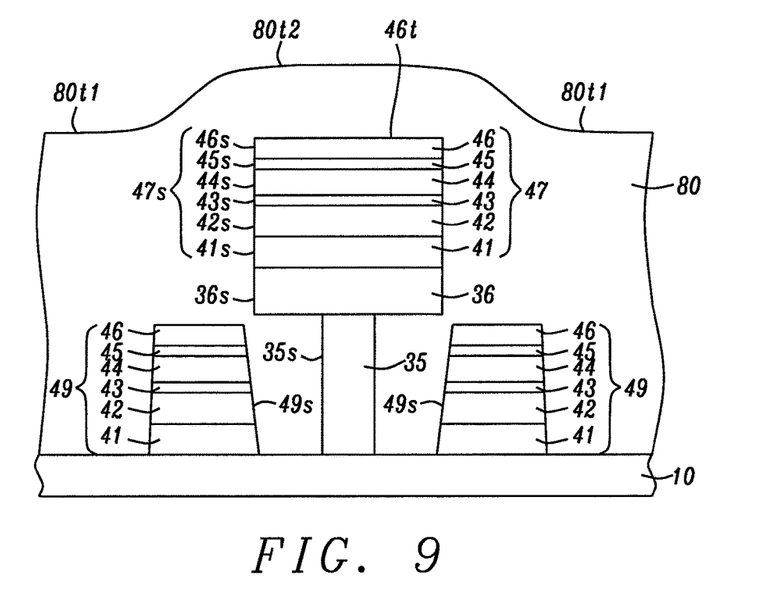
FIG. 9 is a cross-sectional view of the MTJ cell in FIG. 8 following deposition of an encapsulation layer for electrical isolation purposes.

Referring to FIG. 9, encapsulation layer 80 is deposited by a CVD, PVD, or PECVD method, for example, on MTJ cell 47, dummy MTJ 49, and on exposed portions of substrate top surface 10t. The deposition process typically involves an elevated temperature that is preferably <400° C. in order to prevent degradation of magnetic properties in the MTJ. The encapsulation layer covers top surface 46t of hard mask 46, and fills gap 60 between first BE layer 35 and dummy MTJ stack 49. The encapsulation process may be performed in a chamber within the sputter deposition tool to improve throughput.

Thereafter, a chemical mechanical polish (CMP) process may be performed to form a top surface 80t on the encapsulation layer that is coplanar with top surface 46t on hard mask 46 as depicted in FIG. 10a. As a result, the hard mask top surface is exposed so that contact may be made with an overlying top electrode in a subsequent step. It should be understood that the MTJ structure in FIG. 10b may be fabricated by starting with the patterned bottom electrode in FIG. 6 and following the sequence of steps previously described with regard to FIGS. 7-9.

Figure 11:
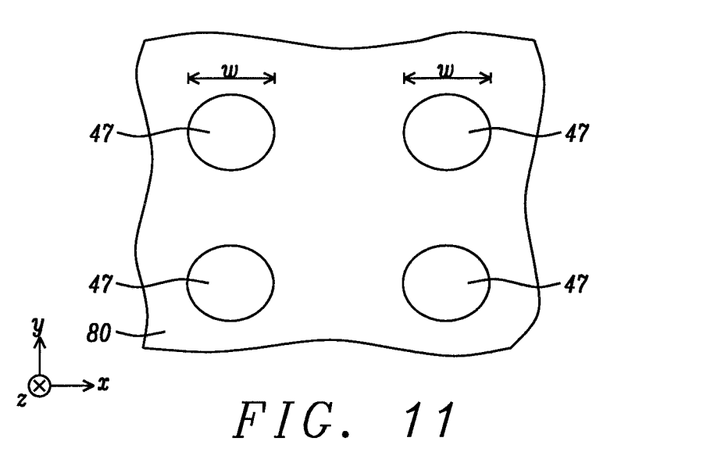
FIG. 11 is a top-down view of a plurality of MTJ cells each having a circular shape in an array of rows and columns after the CMP process in FIG. 10a or FIG. 10b according to an embodiment of the present disclosure.

Referring to FIG. 11, a plurality of MTJ cells 47 formed by the process flow of the present disclosure is depicted from a top-down view. MTJ cells are aligned in rows and columns within the resulting MTJ array. Although the MTJ cells are depicted with a circular shape, the MTJs may have elliptical shapes or even polygonal shapes in other embodiments. Generally, millions of MTJ cells are formed in a memory array but only four are illustrated here to simplify the drawing.

Thereafter, a top electrode layer comprised of a plurality of parallel conductive lines (not shown) is formed by a conventional method on the MTJ cells 47 and encapsulation layer 80 as appreciated by those skilled in the art. One top electrode line contacts hard mask top surface 46t. Conductive lines in the top electrode layer are preferably formed along the y-axis direction that is orthogonal to the conductive (bit) lines (not shown) along the x-axis direction in substrate 10.

Figure 12:
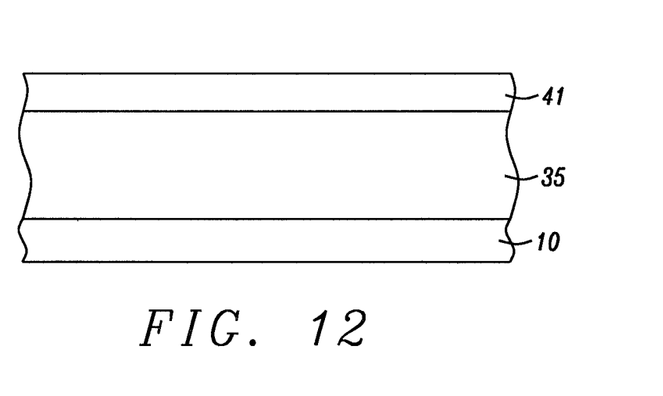
FIG. 12 is cross-sectional view that depicts a first BE layer and seed layer sequentially formed on a substrate according to an embodiment described herein.

A process sequence for fabricating MTJ cell 47 in FIG. 18a is illustrated in FIGS. 12-17 and is similar to the sequence in FIGS. 3-5 and FIGS. 7-9 except that a shorter total process time is required. In particular, a key feature as shown in FIG. 12 is that seed layer 41 may be blanket deposited on the first BE layer 35 before the patterning step to define the bottom electrode width. Thus, the bottom electrode in this embodiment is effectively comprised of a bottom first BE layer and an upper seed layer. Here, the seed layer may comprise one or more of Ni, NiCr, Ru, or NiFeCr while the first BE layer may be Ta, TaN, Ti, TiN, or another material with an etch rate substantially greater than that of the seed layer in a subsequent isotropic RIE step which generates sidewall 35s.

Throughput is improved compared with the first embodiment because the seed layer is advantageously deposited in a different sputter deposition tool or in a different process chamber of the same sputter deposition tool than MTJ layers 42-46 in a later self-aligned process step. Typically, the deposition time for MTJ layers 41-46 is the bottleneck with regard to total process time. By maintaining the same number of sputter deposition tools to minimize cost, MTJ cells are completed with a shorter amount of total process time since the MTJ stack formed in the self-aligned process has one less layer than in the previous embodiment because seed layer 41 is effectively part of the bottom electrode.

Figure 13:
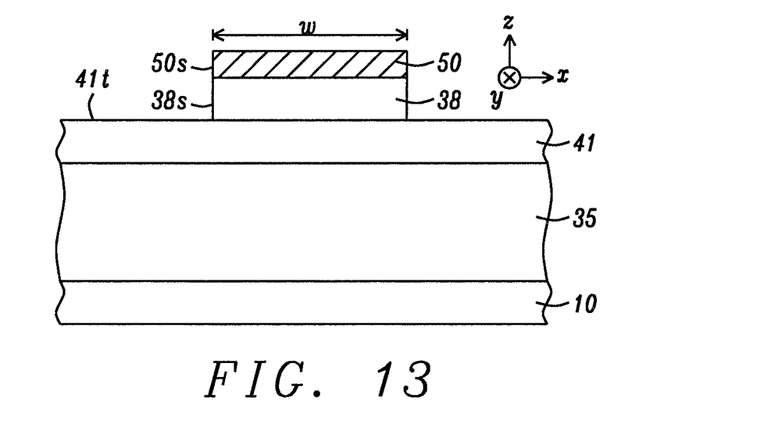
FIGS. 13-14 are cross-sectional views of the structure in FIG. 12 after a hard mask is deposited on the first BE layer, and a patterning process and subsequent etch steps are used to form a bottom electrode T-shape where the seed layer has a greater width than the first BE layer according to a second embodiment of the present disclosure.

Referring to FIG. 13, a hard mask 38 described previously, and photoresist layer 50 are sequentially formed on seed layer 41. The photoresist layer is then patterned to provide a photoresist mask with sidewall 50s and width w. A first RIE process comprising a fluorocarbon and a RF power from 100 to 1500 Watts, for example, is employed to remove exposed regions of the hard mask that are not protected by the photoresist mask thereby yielding sidewall 38s that is coplanar with sidewall 50s.

Figure 14:
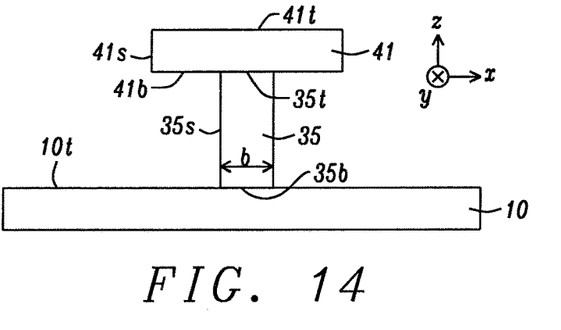

Referring to FIG. 14, a second RIE that may be comprised of Ar and MeOH is used to remove portions of the seed layer 41 that are not protected by the hard mask 38 to form seed layer sidewall 41s that is coplanar with sidewall 38s. Generally, photoresist layer 50 is removed with an oxygen plasma strip process before the second RIE step. Thereafter, a third RIE that is an isotropic etch is employed to advantageously form the T shape profile for the bottom electrode. In a preferred embodiment, the third RIE comprises fluorocarbon plasma that removes the hard mask and exposes top surface 41t. The seed layer (and substrate) are substantially more resistant to the fluorocarbon plasma than the first BE layer so that the seed layer maintains width w, and the third RIE step stops on substrate top surface 10t. In the exemplary embodiment, sidewall 35s has a substantially vertical profile. Depending on the etch conditions and composition of the first BE layer 35, the third RIE may generate a sloped sidewall 35s where the width at the first BE top surface 35t is less than w, but is greater than b at the base 35b.

Figure 15:
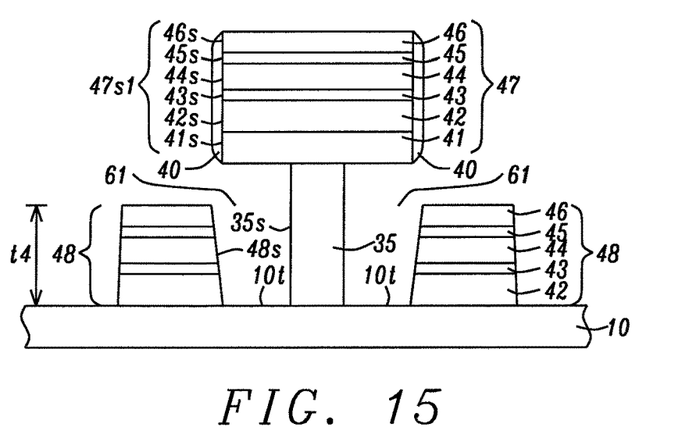

Referring to FIG. 15, MTJ layers 42-46 are sequentially deposited in a sputter deposition tool on seed layer top surface 41t. Here, the aforementioned MTJ layers are self-aligned to seed layer 41 rather than to a second BE layer. Sidewalls 42s-46s are coplanar and shown collectively as sidewall 47s1 that is coplanar with seed layer sidewall 41s. As in the previous embodiment, a sidewall layer 40 comprised of material from MTJ layers 42-46 is usually formed on sidewalls 41s, 47s1. Furthermore, a dummy MTJ stack 48 comprised of MTJ layers 42-46 with sidewall 48s is formed on substrate top surface 10t around the first BE layer 35 and is separated from sidewall 35s by gap 61. Another advantage of replacing the second BE layer with seed layer 41 in this embodiment is that the dummy MTJ stack has thickness t4 that is less than t3 of the dummy MTJ stack in the previous embodiment. As a result, top surface 48t of the dummy MTJ is a greater distance from seed layer 41 in MTJ 47 when the BE layer maintains thickness t1, and all MTJ layers have the same thickness as in the first embodiment.

Figure 16:
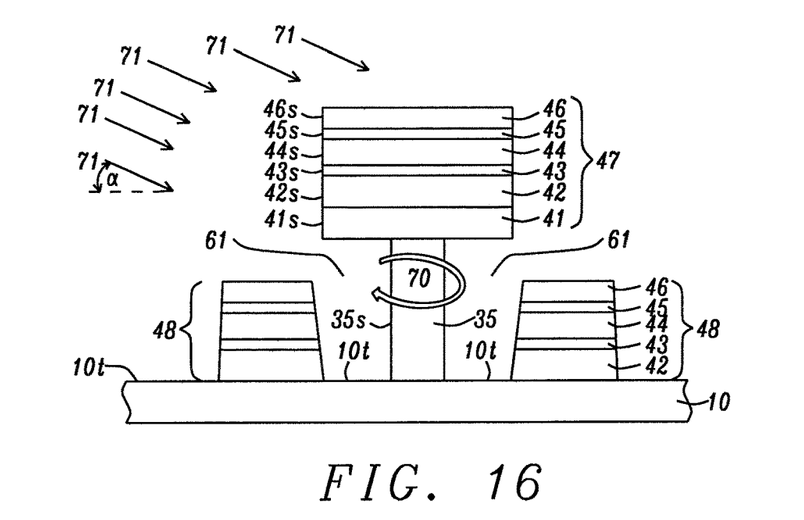

In FIG. 16, an IBE step comprised of ions 71 directed at an incident angle α less than 90° with respect to sidewall 47s1, and rotation 70 of substrate 10 is employed to remove the sidewall layer 40 and provide clean sidewalls 41s, 47s1. As mentioned earlier, the IBE does not require an over etch and is typically accomplished in less than 180 seconds and with a voltage of <200 eV.

Figure 17:
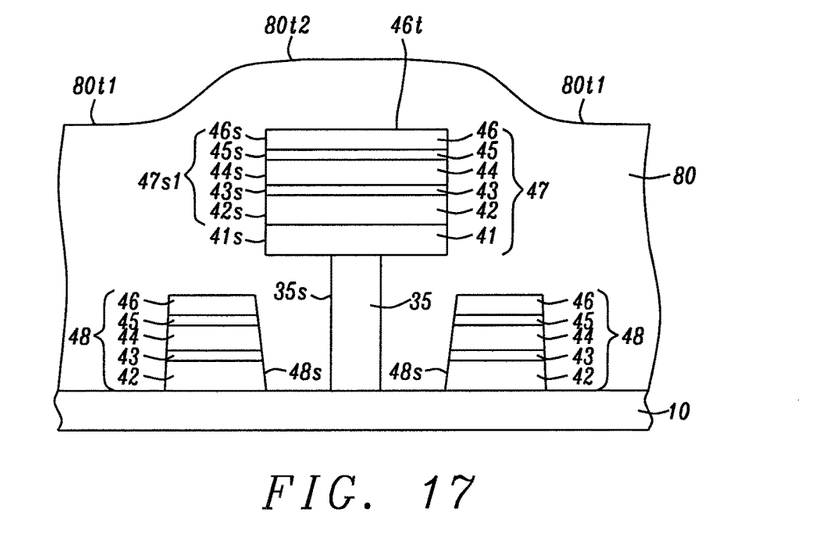

With regard to FIG. 17, encapsulation layer 80 is deposited on MTJ cell 47, dummy MTJ 48, and on exposed portions of the substrate 10 thereby filling gap 61 and insulating the MTJ cell from adjacent MTJ cells (not shown). A top surface 80t2 of the encapsulation layer above hard mask top surface 46t is generally a greater distance from substrate 10 than portions 80t1 above dummy MTJ stack 48. In a following step, a CMP process may be used to expose hard mask 46 by forming encapsulation layer top surface 80t that is coplanar with top surface 46t.

Figure 19:
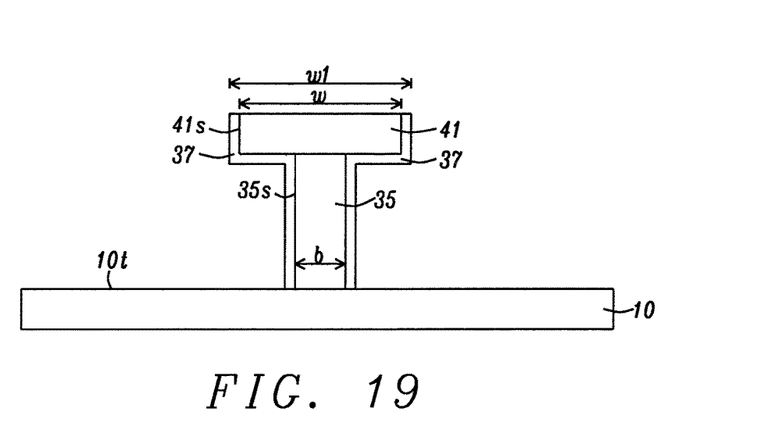
FIG. 19 shows a cross-sectional view of an intermediate step during the formation of the MTJ cell in FIG. 18b wherein a dielectric layer is formed on sidewalls of the patterned bottom electrode before depositing the MTJ layers.

The alternative MTJ structure shown in FIG. 18b may be formed using a process flow starting with the T shaped bottom electrode in FIG. 14, and then conformally depositing dielectric layer 37 by a CVD method to give the bottom electrode structure shown in FIG. 19. Then the sequence of steps depicted in FIGS. 15-17 is followed. In this case, MTJ layers 42-46 are self-aligned to the seed layer 41 and layer 37, and have a width w1 greater than width w of the seed layer due to the presence of the dielectric layer that was deposited on sidewall 41s.

Another advantage of the first and second embodiments depicted in FIG. 10a and FIG. 18a, respectively, and the alternative embodiments in FIG. 10b and FIG. 18b is that the MTJ layers are deposited in segmented islands each having a width w or w1 typically less than 100 nm rather than as a blanket deposited (continuous) film over multiple millimeters. Accordingly, film stress and stress related defects are substantially reduced compared with conventional MTJ cell fabrication methods.

While this disclosure has been particularly shown and described with reference to, the preferred embodiment thereof, it will be understood by those skilled in the art that various changes in form and details may be made without departing from the spirit and scope of this disclosure.

We claim:

1. A memory structure, comprising:
   (a) a bottom electrode (BE) comprised of a first BE layer contacting a substrate, and a second BE layer adjoining a top surface of the first BE layer wherein the BE is substantially in the form of a T shape in which the first BE layer has a sidewall, and a top surface having a first width substantially less than a second width of the second BE layer, and the second BE layer has a second sidewall aligned essentially orthogonal with regard to the substrate; and
   (b) a magnetic tunnel junction (MTJ) stack of layers formed on a top surface of the second BE layer, and having the second width and a sidewall that is coplanar with the second BE sidewall, wherein the MTJ stack is self-aligned to the bottom electrode.

2. The memory structure of claim 1 wherein the MTJ stack is a MTJ cell that has a bottommost seed layer on the second BE layer, a tunnel barrier layer formed between a pinned layer and a free layer, and an uppermost hard mask.

3. The memory structure of claim 1 wherein the second BE layer serves as a seed layer for the MTJ stack that includes a tunnel barrier layer formed between a free layer and a pinned layer, and an uppermost hard mask, and together with the MTJ stack forms a MTJ cell.

4. The memory structure of claim 1 further comprised of a dummy MTJ stack of layers that is electrically isolated from the MTJ stack of layers and BE, and formed on a top surface of the substrate, and surrounding the first BE layer such that a sidewall of the dummy MTJ stack is separated from the first BE sidewall by a gap.

5. The memory structure of claim 4 wherein the memory structure is further comprised of an encapsulation layer that insulates the MTJ stack from adjacent MTJ stacks of layers, and wherein the encapsulation layer fills the gap between the dummy MTJ stack of layers and first BE layer.

6. The memory structure of claim 4 wherein the first BE layer is comprised of Ta, TaN, Ti, or TiN, and has a first thickness greater than a thickness of the dummy stack of layers.

7. The memory structure of claim 6 wherein the second BE layer is comprised of Ni, NiCr, Ru, or NiFeCr, and has a second thickness less than the first thickness.

8. A memory structure, comprising:
   (a) a bottom electrode (BE) comprised of a first BE layer contacting a substrate, and an upper second BE layer adjoining a top surface of the first BE layer wherein the BE is substantially in the form of a T shape in which the first BE layer has a sidewall, and a top surface having a first width substantially less than a second width of the second BE layer, and the second BE layer has a second sidewall aligned essentially orthogonal with regard to the substrate;
   (b) a dielectric layer that is conformally formed on the second BE sidewall and a bottom surface of the second BE layer, and on the first BE layer sidewall and having a third sidewall proximate to the second BE sidewall that is aligned orthogonal with respect to the substrate; and
   (c) a magnetic tunnel junction (MTJ) stack of layers that is self-aligned to the second BE layer and dielectric layer such that a sidewall on the MTJ stack is coplanar with the third sidewall, and the width of each of the MTJ stack of layers is greater than the second width.

9. The memory structure of claim 8 wherein the MTJ stack is a MTJ cell that has a bottommost seed layer on the second BE layer, a tunnel barrier layer formed between a pinned layer and a free layer, and an uppermost hard mask.

10. The memory structure of claim 8 wherein the second BE layer serves as a seed layer for the MTJ stack that includes a tunnel barrier layer formed between a free layer and a pinned layer, and an uppermost hard mask, and together with the MTJ stack forms a MTJ cell.

11. The memory structure of claim 8 further comprised of a dummy MTJ stack of layers that is electrically isolated from the MTJ stack of layers and BE, and formed on a top surface of the substrate, and surrounding the first BE layer such that a sidewall of the dummy MTJ stack is separated from the first BE sidewall by a gap.

12. The memory structure of claim 11 wherein the memory structure is further comprised of an encapsulation layer that insulates the MTJ stack of layers from adjacent MTJ stacks of layers, and wherein the encapsulation layer fills the gap between the dummy MTJ stack and first BE layer.

13. The memory structure of claim 11 wherein the first BE layer is comprised of Ta, TaN, Ti, or TiN, and has a first thickness greater than a thickness of the dummy MTJ stack of layers.

14. The memory structure of claim 13 wherein the second BE layer is comprised of Ni, NiCr, Ru, or NiFeCr, and has a second thickness less than the first thickness.

15. A method of forming a magnetic tunnel junction (MTJ) cell, comprising:
   (a) forming a patterned bottom electrode (BE) wherein the BE has a first BE layer contacting a top surface of a substrate and having a first width (w1) and a first sidewall, and a second BE layer with a second width (w2) formed on a top surface of the first BE layer where w2>w1, and having a second sidewall aligned essentially orthogonal with respect to the substrate thereby forming a substantially T shape for the patterned bottom electrode;
   (b) sputter depositing a MTJ stack of layers that is self-aligned to the second BE layer such that the MTJ stack has the second width and a sidewall that is coplanar with the second sidewall of the second BE layer; and
   (c) cleaning the MTJ sidewall by performing an ion beam etch comprised of ions with an incident angle less than 90° with respect to the MTJ sidewall, and rotating the substrate.

16. The method of claim 15 wherein forming the patterned BE comprises:

(a) sequentially depositing the first BE layer, second BE layer, and a hard mask on the substrate;
(b) forming a photo mask on the hard mask, and then performing a first etch process to form a hard mask sidewall that stops on a top surface of the second BE layer;
(c) performing a second etch step to form the second BE sidewall that stops on the top surface of the first BE layer; and
(d) performing a third etch that is an isotropic process to selectively remove portions of the first BE layer thereby exposing the top surface of the substrate and forming the first BE sidewall having the first width.

17. The method of claim 16 wherein the second etch step is a reactive ion etch comprising a noble gas, MeOH, and a RF power that generates a plasma.

18. The method of claim 16 wherein the first BE layer is comprised of Ta, TaN, Ti, or TiN, and the second BE layer is comprised of Ni, NiCr, Ru, or NiFeCr.

19. The method of claim 15 wherein the second BE layer is a seed layer and together with the MTJ stack of layers forms a MTJ cell.

20. A method of forming a magnetic tunnel junction (MTJ) cell, comprising:
(a) forming a patterned bottom electrode (BE) wherein the BE has a first BE layer contacting a top surface of a substrate and having a first width (w1) and a first sidewall, and a second BE layer with a second width (w2) formed on a top surface of the first BE layer where w2>w1, and having a second sidewall aligned essentially orthogonal with respect to the substrate;
(b) forming a conformal dielectric layer on the first and second sidewalls and having a third sidewall proximate to the second sidewall wherein the third sidewall is aligned orthogonal with respect to the substrate;
(c) sputter depositing a MTJ stack of layers on the second BE layer, wherein the MTJ stack is self-aligned to the second BE layer and dielectric layer, and has a sidewall that is coplanar with the third sidewall; and
(d) cleaning the MTJ sidewall by performing an ion beam etch comprised of ions an incident angle less than 90° with respect to the MTJ sidewall, and rotating the substrate.

21. The method of claim 20 wherein forming the patterned BE comprises:
(a) sequentially depositing the first BE layer, second BE layer, and then a hard mask on the substrate;
(b) forming a photo mask on the hard mask, and then performing a first etch to form a hard mask sidewall that stops on the top surface of the second BE layer;
(c) performing a second etch step that forms the second sidewall and stops on a top surface of the first BE layer; and
(d) performing a third etch that is an isotropic process to selectively remove portions of the first BE layer thereby exposing the top surface of the substrate and forming the first BE sidewall having the first width.

22. The method of claim 21 wherein the second etch is a reactive ion etch comprising a noble gas, MeOH, and a RF power that generates a plasma.

23. The method of claim 21 wherein the first BE layer is comprised of Ta, TaN, Ti, or TiN, and the second BE layer is comprised of Ni, NiCr, Ru, or NiFeCr.

24. The method of claim 20 wherein the second BE layer is a seed layer and together with the MTJ stack of layers forms a MTJ cell.

* * * * *